United States Patent
Kim et al.

(10) Patent No.: US 7,302,022 B2
(45) Date of Patent: Nov. 27, 2007

(54) AUTOMATIC GAIN CONTROL DEVICE AND METHOD IN ORTHOGONAL FREQUENCY DIVISION MULTIPLEXING SYSTEM WITH DC OFFSET COMPENSATION FUNCTION, AND RECORDING MEDIUM STORING PROGRAM CONTAINING THE METHOD

(75) Inventors: Jun-Woo Kim, Daejeon (KR); Young-Ha Lee, Daejeon (KR); Chang-Wahn Yu, Daejeon (KR); Dae-Ho Kim, Daejeon (KR); Youn-Ok Park, Daejeon (KR)

(73) Assignee: Electronics and Telecommunications Research Institute (KR)

( * ) Notice: Subject to any disclaimer, the term of this patent is extended or adjusted under 35 U.S.C. 154(b) by 738 days.

(21) Appl. No.: 10/687,355

(22) Filed: Oct. 15, 2003

(65) Prior Publication Data
US 2004/0202102 A1    Oct. 14, 2004

(30) Foreign Application Priority Data
Apr. 10, 2003    (KR) ...................... 10-2003-0022560

(51) Int. Cl.
*H04L 27/08*    (2006.01)
(52) U.S. Cl. ................... 375/345; 455/127.2; 455/219; 455/232.1; 455/239.1; 455/240.1; 455/241.1; 455/245.1
(58) Field of Classification Search ................ 375/345; 330/129, 278; 370/208; 704/225; 381/321; 455/127.2, 219, 232.1, 239.1, 240.1, 241.1, 455/245.1
See application file for complete search history.

(56) References Cited

U.S. PATENT DOCUMENTS

| | | | | |
|---|---|---|---|---|
| 5,420,536 | A | * | 5/1995 | Faulkner et al. ............. 330/149 |
| 5,812,025 | A | * | 9/1998 | Shimazaki ................... 330/129 |
| 5,946,607 | A | * | 8/1999 | Shiino et al. ............. 455/234.1 |

(Continued)

FOREIGN PATENT DOCUMENTS

| | | |
|---|---|---|
| JP | 2003-032216 | 1/2003 |
| KR | 1020000050509 | 8/2000 |
| KR | 10-2002-0090562 | 5/2002 |
| KR | 1020020090562 | 12/2002 |

OTHER PUBLICATIONS

Renny E. Badra, et al., "Automatic Gain Control In Adaptive Precoded Communication Systems"; Wireless Systems Research Laboratory, University of California, 1998.

*Primary Examiner*—Curtis Odom
(74) *Attorney, Agent, or Firm*—Blakely, Sokoloff, Taylor & Zafman (57) ABSTRACT

Disclosed is an AGC (automatic gain control) device and method of an OFDM system with a DC offset compensation function, and a recording medium storing a program including the method. The AGC device calculates an energy of input signals with DC offsets as the summation of the square of the input signals, and calculates an energy of the DC offsets in the input signals as the summation of the square of the DC offsets. Pure signal energy without DC offsets is produced by subtracting the energy of the DC offsets from the energy of the calculated input signal. The energy and an AGC reference value are then compared, and feedback of a comparison result is performed.

14 Claims, 4 Drawing Sheets

U.S. PATENT DOCUMENTS

| | | |
|---|---|---|
| 6,363,127 B1 | 3/2002 | Heinonen et al. |
| 6,687,723 B1 * | 2/2004 | Ding .......................... 708/322 |
| 6,714,605 B2 * | 3/2004 | Sugar et al. ................ 375/340 |
| 2002/0075946 A1 * | 6/2002 | Seo et al. ................... 375/148 |
| 2003/0152021 A1 * | 8/2003 | Wang et al. ................ 370/208 |
| 2004/0013209 A1 * | 1/2004 | Zehavi et al. .............. 375/334 |

* cited by examiner

AUTOMATIC GAIN CONTROL DEVICE AND METHOD IN ORTHOGONAL FREQUENCY DIVISION MULTIPLEXING SYSTEM WITH DC OFFSET COMPENSATION FUNCTION, AND RECORDING MEDIUM STORING PROGRAM CONTAINING THE METHOD

CROSS REFERENCE TO RELATED APPLICATION

This application is based on Korea Patent Application No. 2003-22560 filed on Apr. 10, 2003 in the Korean Intellectual Property Office, the content of which is incorporated herein by reference.

BACKGROUND OF THE INVENTION (a) Field of the Invention

The present invention relates to an OFDM (orthogonal frequency division multiplexing) system. More specifically, the present invention relates to an AGC (automatic gain control) device and method in an OFDM system with a DC offset compensation function, and a recording medium storing a program containing the method.

(b) Description of the Related Art

AGC and the DC offset calculations are typically sequentially performed in a training sequence interval in the conventional OFDM system. Such AGC and DC offset calculations in the conventional OFDM system will now be described.

Figure 1:
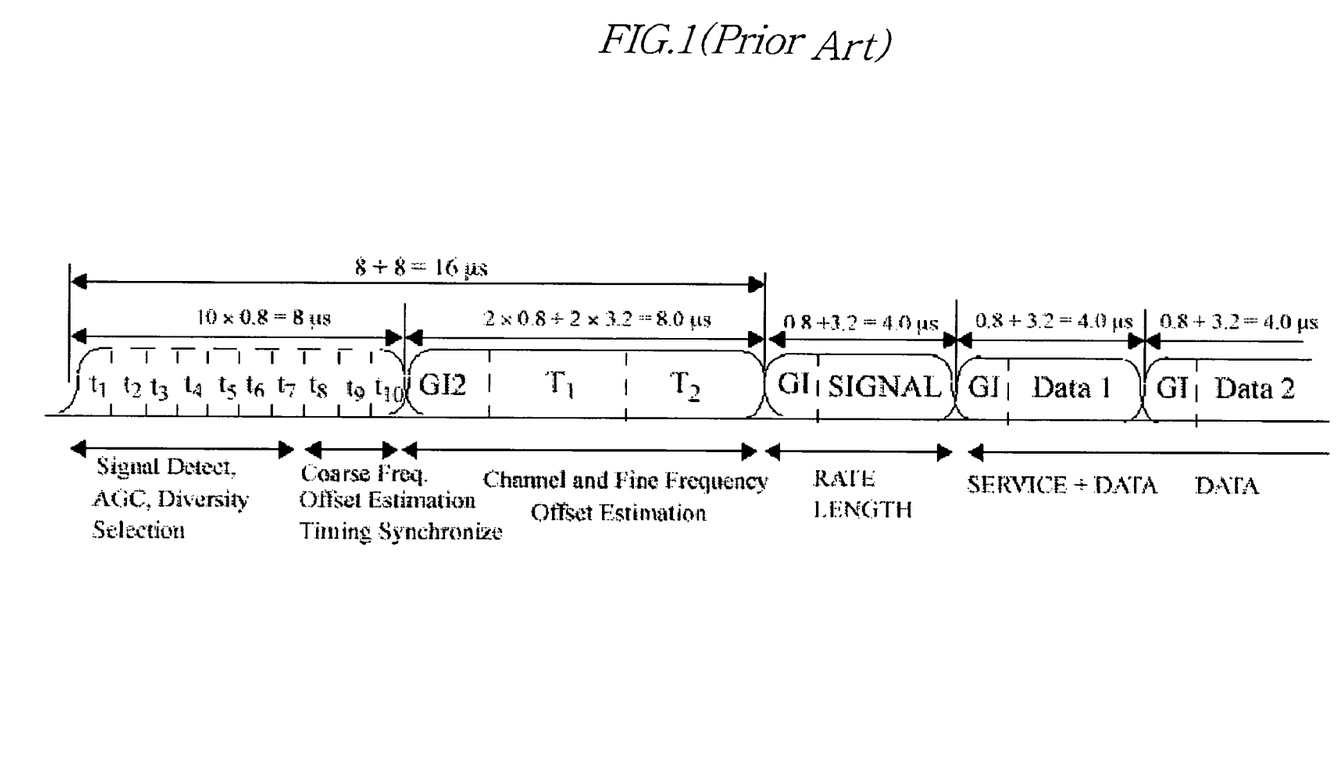
FIG. 1 shows a preamble configuration of the IEEE 802.11a WLAN, which is one type of an OFDM system.

FIG. 1 shows a preamble configuration of the IEEE 802.11a WLAN, which is one type of an OFDM system.

As shown in FIG. 1, the preamble of the IEEE 802.11a includes a short training sequence and a long training sequence. The short training sequence is used for signal recognition, AGC, and coarse frequency offset estimation, and the long training sequence is used for fine sequence sync acquisition and fine frequency offset estimation.

These training sequences have normalized power, but data sequences do not have constant energies because the data sequences are obtained by performing IFFT (inverse fast Fourier transform) on data. Accordingly, it is necessary to perform AGC by using training sequences in the preamble interval.

Korean published application No. 2002-090562 discloses "An automatic gain control device of orthogonal frequency division multiplexing signals, and an automatic gain control method using the device". This patent is characterized in that a two-stage AGC is executed using a digital AGC device. However, there is no disclosure in this patent of the affect of DC offsets in the AGC device.

An AGC device of the general OFDM system determines the energy of input I and Q data, calculates a mean value thereof, converts the mean value into a dB value that will be compensated for by the AGC device, and performs feedback of a difference between the converted dB value and a reference value to control the gain in the training sequence. The short training sequence is divided into a plurality of repeated intervals for the calculation of frequency offsets, and a mean value of each interval is 0. The long training sequence is divided into two repeated intervals (not including a CP, or cyclic prefix), and a mean value of each interval is 0. The mean value of the CP interval is not guaranteed to be 0, and in the case of the IEEE 802.11a, the mean value of the CP interval of the long training sequence is not zero and instead is a very large value. Since the data sequences (except the training sequences) are results obtained by performing IFFT on random values, the mean value for a predetermined interval is not constant and is a very large value. Therefore, the mean value is needed to calculate the DC offset and cancel the same in the training sequence interval.

Also, a device for determining the DC offset in the general OFDM system performs its operation by simply accumulating input I and Q data for a predetermined interval and taking a mean value of the accumulated data.

The general OFDM system performs AGC while assuming the DC offset to be an ignorable small value, after which the system calculates the DC offset to cancel the same. However, a drawback of this process is that it causes a reduction in accuracy in the initial sync acquisition stage. The DC offset problem is made worse if using the direct conversion method (i.e., converting RF, or radio frequency, signals directly into baseband frequency signals without using an IF, or intermediate frequency band), which is currently being developed for use in low price receiving systems.

Also, radio LANs do not load information on a subcarrier corresponding to a DC frequency to reduce or negate the affect of DC offset. Although such a method works well in the frequency domain, it reduces accuracy when performing operations in the time domain (e.g., initial synchronization and AGC).

Figure 2:
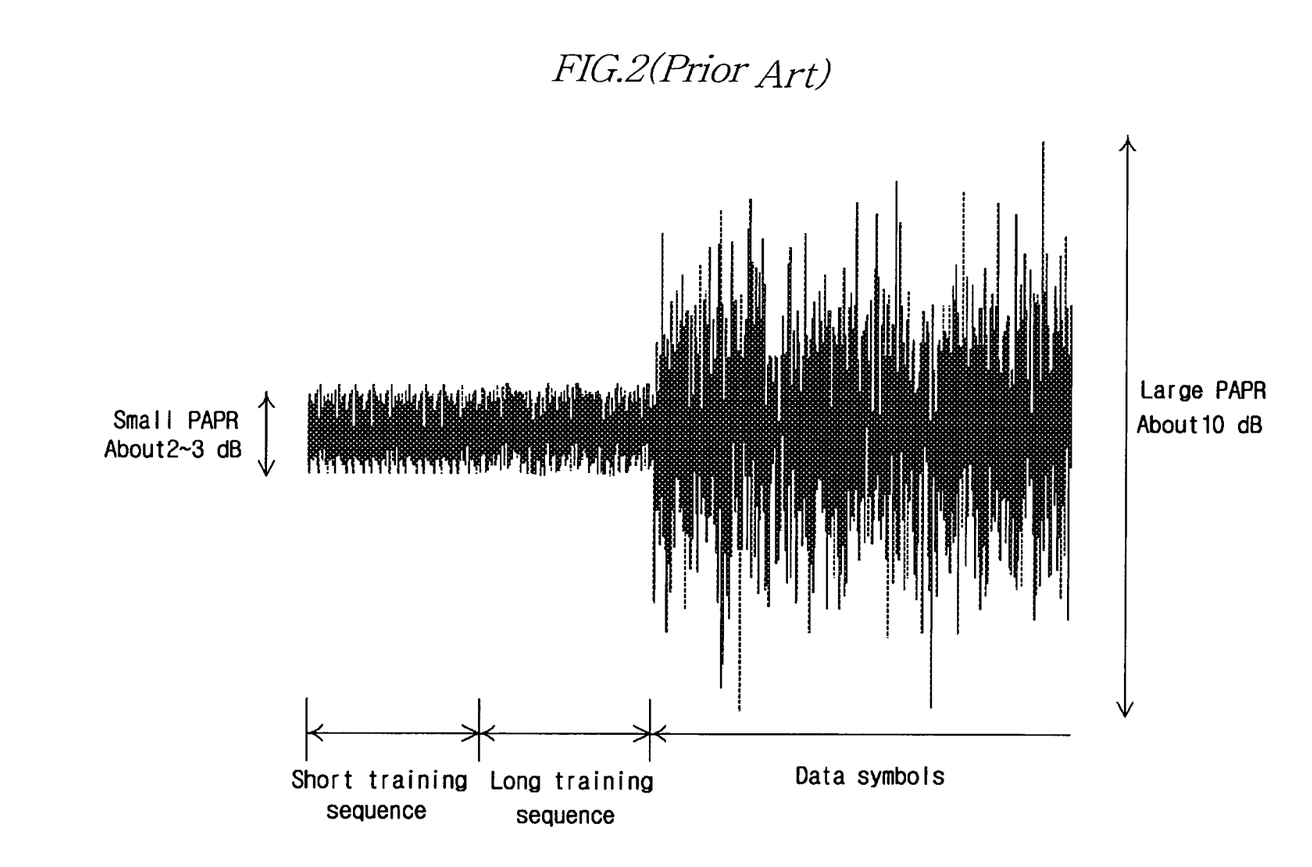
FIG. 2 shows a temporal domain waveform of an OFDM system.

Further, as shown in FIG. 2, which illustrates an actual time domain waveform of an OFDM system, since the intensity of the training sequence is less than that of the data sequence by roughly 10 dB, the training sequence is very sensitive to even low levels of DC offset. For example, when the maximum voltage intensity of input data is 2 Vp-p, the maximum voltage intensity of a training sequence is approximately 0.2 Vp-p. If a DC offset of 0.01V is generated in this case, although this corresponds to merely 0.5% of the input data, it corresponds to a much larger error of 5% with respect to the training sequence.

SUMMARY OF THE INVENTION

It is an advantage of the present invention to provide an AGC device and method in an OFDM system with a DC offset compensation function, in which the AGC device and method perform signal recognition, AGC, and the determination of a DC offset to cancel its effects. The present invention also provides a recording medium for storing a program containing the method.

In one aspect of the present invention, an AGC device in an OFDM system comprises an RF unit for controlling a gain of an input signal; a first energy calculator for calculating an energy of the input signal; a first accumulator for accumulating the energy calculated by the first energy calculator, finding a mean value thereof, and outputting the mean value; a second accumulator for producing a DC offset of the input signal; a second energy calculator for calculating an energy of the DC offset produced by the second accumulator; a subtractor for subtracting the energy of the DC offset of the input signal output by the second energy calculator from the energy of the input signal output by the first accumulator; and a comparator for comparing an output of the subtractor with a specific reference value established for AGC, and performing feedback of a comparison result for AGC to the RF unit.

The energy calculation for AGC is performed in a training sequence interval of the input signal.

The energy calculation is performed for each interval with 16 samples when the training sequence interval is a short training sequence interval.

The energy calculation is performed for each interval with 64 samples when the training sequence interval is a long training sequence interval.

The first and second energy calculators find a summation of the square of the input signal, and output a result as an energy.

In another aspect of the present invention, an AGC method in an OFDM system comprises (a) performing coarse AGC through a DC offset cancellation in a short training sequence interval when an input signal is detected, the AGC being performed by subtracting an energy of the DC offset from an energy of the input signal and using an energy of the DC offset cancelled ideal signal; (b) performing a coarse frequency offset search and cancellation in the short training sequence interval; (c) performing fine AGC through a DC offset cancellation in a long training sequence interval, the AGC being performed by subtracting the energy of the DC offset from the energy of the input signal and using the energy of the DC offset cancelled ideal signal; and (d) performing a fine frequency offset search and cancellation in the long training sequence interval.

(b) is performed in the final three repeated intervals of the short training sequence.

BRIEF DESCRIPTION OF THE DRAWINGS

The accompanying drawings, which are incorporated in and constitute a part of the specification, illustrate an embodiment of the invention, and, together with the description, serve to explain the principles of the invention.

DETAILED DESCRIPTION OF THE PREFERRED EMBODIMENTS

In the following detailed description, only the preferred embodiments of the invention have been shown and described, simply by way of illustration of the best mode contemplated by the inventor(s) of carrying out the invention. As will be realized, the invention is capable of modification in various obvious respects, all without departing from the invention. Accordingly, the drawings and description are to be regarded as illustrative in nature, and not restrictive.

An AGC device of an OFDM system according to a preferred embodiment of the present invention will be described with reference to the drawings.

Figure 3:
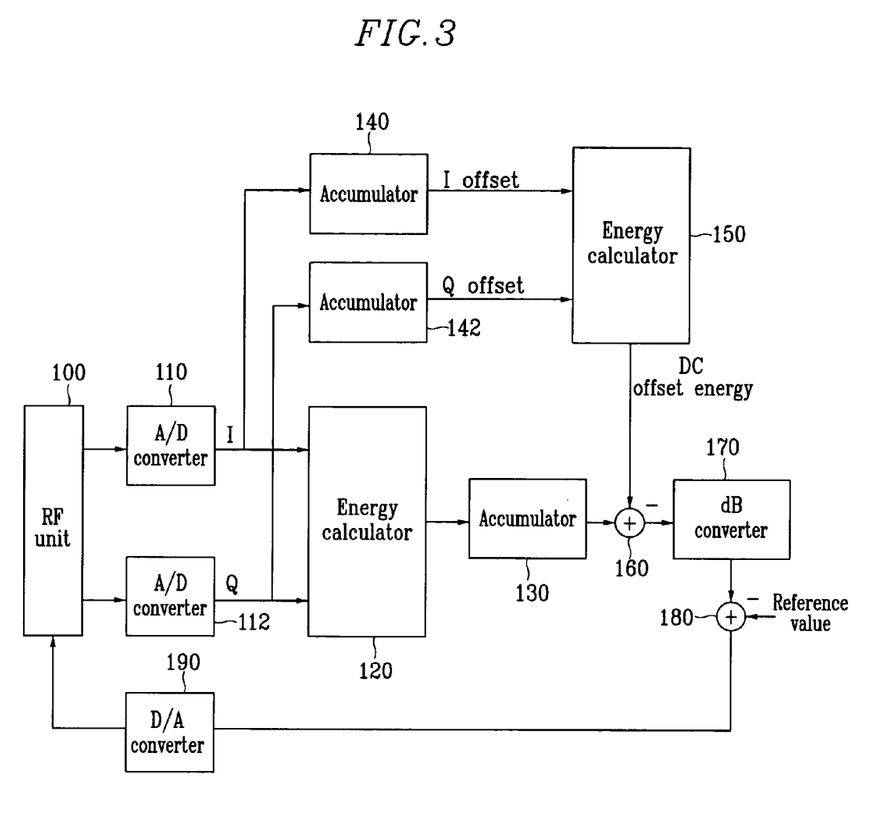
FIG. 3 shows a block diagram of an AGC device of an OFDM system according to a preferred embodiment of the present invention.

FIG. 3 shows a block diagram of an AGC device of an OFDM system according to a preferred embodiment of the present invention.

As shown in FIG. 3, the AGC device comprises an RF unit 100, two A/D (analog-to-digital) converters 110 and 112, two energy calculators 120 and 150, three accumulators 130, 140, and 142, two subtractors 160 and 180, a dB converter 170, and a D/A (digital-to-analog) converter 190.

The RF unit 100 functions as an interface that allows for the input of analog I and Q signals to the AGC device in the OFDM system.

The A/D converters 110 and 112 respectively convert the analog I and Q signals into digital I and Q signals, then output the digital I and Q signals.

The energy calculator 120 determines energies of the digital I and Q signals (referred to simply as I and Q signals hereinafter) by calculating the summation of the square of the input I and Q signals. The energy calculator 120 then outputs the resulting values.

The accumulator 130 accumulates, for a predetermined interval of time, the energy values output by the energy calculator 120, finds a mean value thereof, and outputs the mean value. That is, the accumulator 130 calculates a mean energy value of a predetermined period, then outputs this mean energy value.

Occurring concurrently with the above, the accumulators 140 and 142 respectively accumulate the I and Q signals output by the A/D converters 110 and 112 for a predetermined time interval. The accumulators 140 and 142 then find mean values of the accumulated I and Q signals, respectively, and output the mean values. That is, the accumulators 140 and 142 find mean values respectively of the I and Q signals of a predetermined period of time, then output the mean values. The mean values are defined as DC offsets of I and Q signals. The accumulation interval is set as the amount of time required to take 16 samples in the case of using a short training sequence, and as the amount of time required to take 64 samples in the case of using a long training sequence.

The energy calculator 150 finds energies of the DC offsets of the I and Q signals output by the accumulators 140 and 142, respectively, by calculating the summation of the square of the DC offsets of the input I and Q signals. The energy calculator 150 then outputs the resulting values.

The subtractor 160 subtracts the value output by the energy calculator 150 from the value output by the accumulator 130, then outputs a resulting value. That is, the subtractor 160 subtracts an energy value resulting from the DC offset from the energy value of the I and Q signals. The dB converter 170 converts the value output by the subtractor 160 into a dB value, then outputs the dB value. Since the values that are to be compensated for by the AGC device are high values in the range of approximately 80 to 100 dB, the dB converter 170 converts the value output by the subtractor 160 into a desired high dB value before performing output.

The subtractor 180 subtracts a preset reference value from the value output by the dB converter 170, then outputs a resulting value.

The D/A converter 190 converts the value output by the subtractor 180 into an analog signal, and performs feedback of this analog value to a variable gain amplifier (not shown) in the RF unit 100 to thereby complete AGC.

An operation of the AGC device of an OFDM system according to the preferred embodiment of the present invention will be described in greater detail below. I and Q signals of the training sequences are input to the AGC device of an OFDM system through the RF unit 100, after which the I and Q signals are converted into digital I and Q data respectively by the A/D converters 110 and 112. The energies of the digital I and Q data are determined by the energy calculator 120. Many methods are used to find the energies of the I and Q data. In the preferred embodiment, the sum of the square of the I and Q data are defined as the energies.

The energies obtained by the energy calculator 120 are accumulated by the accumulator 130 for a predetermined period of time, then the accumulator calculates their mean value and outputs the mean value to the subtractor 160. In the case of using a short training sequence of IEEE 802.11a, the accumulating interval is the amount of time required to take 16 samples.

The digital I and Q data output by the A/D converters 110 and 112 are accumulated by the accumulators 140 and 142 for a predetermined interval of time. The means of the accumulated I and Q data are found by the accumulators 140 and 142 then output to the energy calculator 150. The values output by the accumulators 140 and 142 are respectively defined as DC offsets of the I and Q signals of the training sequence input to the AGC device of the OFDM system.

The energies of the DC offsets of the I and Q signals output by the accumulators 140 and 142 are found by the energy calculator 150. The energy calculator 150 functions identically as the energy calculator 120 used for calculating the energies of the I and Q signals. Therefore, the energy calculator 150 finds the sum of the square of the DC offsets of the I and Q signals, then outputs the resulting value to the subtractor 160.

As described above, the subtractor 160 receives the energy value of the I and Q signals with the DC offset from the accumulator 130, and the energy value of the I and Q DC offsets from the energy calculator 150. Therefore, when the subtractor 160 subtracts the value output by the energy calculator 150 from the value output by the accumulator 130, pure energy values of the I and Q signals without DC offsets are found.

The above results will now be described through the use of equations.

If $R_i$ and $R_q$ are respectively I and Q values output through the A/D converters 110 and 112, these values can be expressed as a summation of ideal signals $S_i$ and $S_q$ (i.e., without DC offsets) and the DC offsets $D_i$ and $D_q$ as shown in Equation 1.

$$R_i = S_i + D_i$$
$$R_q = S_q + D_q \qquad \text{Equation 1}$$

Hence, the energy value Enêrgy obtained by accumulating the energy found by the energy calculator 120 for a predetermined interval, finding a mean value thereof, and outputting the mean value can be given as Equation 2. The energy value in this instance is an energy value found by the AGC device when the DC offset is provided.

$$\widehat{\text{Energy}} = \frac{1}{N} \sum_{n=1}^{N} (Ri(n)^2 + Rq(n)^2) \qquad \text{Equation 2}$$

$$= \frac{1}{N} \sum_{n=1}^{N} [(Si(n) + Di)^2 + (Sq(n) + Dq)^2]$$

$$= \frac{1}{N} \sum_{n=1}^{N} [Si(n)^2 + Sq(n)^2] + \frac{2Di}{N} \sum_{n=1}^{N} Si(n) +$$

$$\frac{2Dq}{N} \sum_{n=1}^{N} Sq(n) + \frac{1}{N} \sum_{n=1}^{N} [Di^2 + Dq^2]$$

The values accumulated by the accumulators 140 and 142 for a predetermined interval, averaged to be a mean value, and then output are DC offsets $D_i$ and $D_q$ of the I and Q signals, and they are given in Equation 3.

$$Di = \frac{1}{N} \sum_{n=1}^{N} Ri(n), \quad Dq = \frac{1}{N} \sum_{n=1}^{N} Rq(n) \qquad \text{Equation 3}$$

The energies of the DC offsets $D_i$ and $D_q$ of the I and Q signals output by the accumulators 140 and 142 are found by the energy calculator 150, then output to the subtractor 160. The energies of the DC offsets $D_i$ and $D_q$ may be expressed as shown in Equation 4.

$$D_i^2 + D_q^2 \qquad \text{Equation 4}$$

Since mean values of the ideal signals $S_i$ and $S_q$ without DC offsets are 0 in a specific interval, and the I and Q DC offsets are constants as shown in Equation 3, Equation 2 reduces to Equation 5. In Equation 5, the specific interval is established as the time required to take 16 random samples in the case of a short training sequence, and 64 random samples in the case of a long training sequence.

$$\widehat{\text{Energy}} = \frac{1}{N} \sum_{n=1}^{N} [Si(n)^2 + Sq(n)^2] + [Di^2 + Dq^2] \qquad \text{Equation 5}$$

$$= \text{Energy} + [Di^2 + Dq^2]$$

It is clear from Equation 5 that the energy value Enêrgy obtained by the AGC device while with the DC offset is calculated by adding the energy $D_i^2 + D_q^2$ of the DC offset to the ideal energy value Energy, which can be found without the DC offset.

The subtractor 160 subtracts the energy $D_i^2 + D_q^2$ of the DC offset found by the energy calculator 150 from the energy value Enêrgy with the DC offset found by the accumulator 130. Accordingly, the value output by the subtractor 160 becomes an ideal energy value Energy which can be found while without the DC offset.

The value output by the subtractor 160, that is, the ideal energy value Energy which can be found while without the DC offset is converted by the dB converter 170 into a high dB value that is to be compensated for by the AGC device, after which the dB converter 170 outputs the converted dB value. The high dB value ranges from approximately 80 to 100 dB.

The value output by the dB converter 170 is input to the subtractor 180 so that the value may be compared with the reference value used for gain control by the AGC device. Such a comparison is made by subtracting the reference value from the input value, after which the subtractor 180 outputs the resulting value.

The value output by the subtractor 180 is converted by the D/A converter 190 into an analog value. The D/A converter 190 then performs feedback of the analog value to the RF unit 100 for AGC.

As described above, accurate gain control can be realized by performing AGC by finding the ideal energy which can be found in a state without the DC offset by subtracting the energy resulting from the DC offset from the energy found while with the DC offset to thus perform AGC. This result can also be applied to other methods of finding energies in the energy calculators 120 and 150, in addition to the method of the preferred embodiment in which the energies are calculated by taking the summation of the square of inputs. This is readily understood by a person skilled in the art to which the present invention pertains.

The AGC device concurrently performs automatic gain control and DC offset cancellation during the training sequence interval, and maintains the energy value and the DC offset value found in the training sequence interval when the data interval starts following the training sequence interval.

With regard to AGC and DC offset cancellation in the training sequence interval, when a short training sequence is integrated for each set of random 16 samples, its mean value is 0. However, the mean value of the integral value of the 16 samples is not 0 in the case of a long training sequence, making it necessary to accumulate 64 samples so that the mean value can be made to be 0. Therefore, the AGC device needs two modes of operation—one using the short training sequence and one using the long training sequence.

In more detail, the AGC device uses a short training sequence to coarsely perform AGC and DC offset cancellation. Next, using a long training sequence, AGC and DC offset cancellation are repeated, then resulting values are checked and fine tuning is performed, thereby allowing for more accurate AGC.

Figure 4:
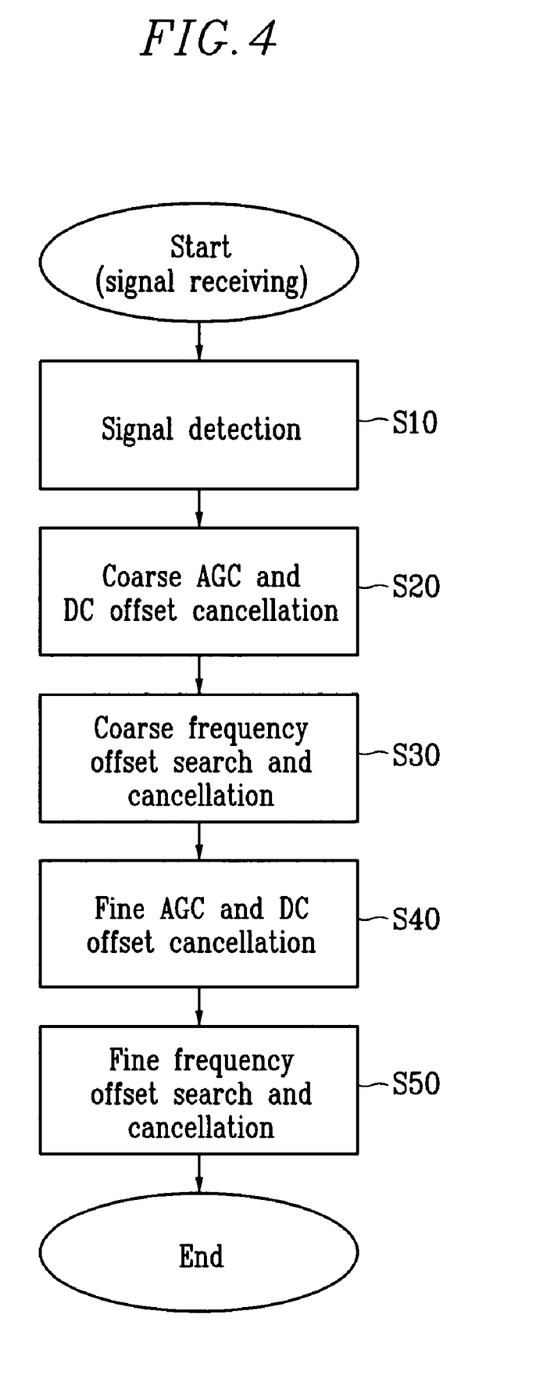
FIG. 4 shows a flowchart an AGC method of an OFDM system according to a preferred embodiment of the present invention.

Referring to FIG. 4, an AGC method of an OFDM system with a function of compensating for DC offset according to the preferred embodiment of the present invention will be described.

When the OFDM system receives a training signal, and a signal detector (not illustrated) detects a short training sequence in step S10, the AGC device performs a coarse AGC and DC offset cancellation operation with the short training sequence interval (i.e., 16 samples as a single interval) in step S20. Since the signal detector is widely used in OFDM systems and so is fully understood by a person skilled in the art, a detailed description thereof will not be provided.

As described with reference to FIG. 3, the AGC and DC offset cancellation operation subtracts the energy of the DC offset from the energy of the signal with the DC offset to find the pure energy of the signal (i.e., without the DC offset) according to the AGC operation.

Next, a coarse frequency offset search and cancellation operation shown in FIG. 1 is performed in the three final repeated intervals of the short training sequence in step S30.

While performing the coarse frequency offset search operation, the AGC and the DC offset calculation processes are continuously performed, but results of the AGC and the DC offset calculation are not transmitted to the RF unit 100 until the frequency offset search operation is finished.

Next, in step S40, the AGC device establishes 64 samples as a single interval in the long training sequence interval to perform fine AGC and DC offset cancellation operations, that is, fine when compared to the coarse AGC and DC offset cancellation operations executed in the previous step S20.

Fine frequency offset search and cancellation operations are performed in a long training sequence interval as shown in FIG. 1 in step S50.

The AGC method in an OFDM system according to the preferred embodiment can be realized as a program and stored on computer-readable recording media (e.g., CD-ROMs, RAMs, ROMs, floppy disks, hard disks, and optical disks).

Hence, in the AGC device and method in an OFDM system with a DC offset compensation function of the present invention, the DC offset search and the AGC operations are concurrently performed, and an accurate gain value is found by reflecting a calculated DC offset value in AGC, thereby allowing accurate AGC to be performed.

While this invention has been described in connection with what is presently considered to be the most practical and preferred embodiments, it is to be understood that the invention is not limited to the disclosed embodiments, but, on the contrary, is intended to cover various modifications and equivalent arrangements included within the spirit and scope of the appended claims.

What is claimed is:

1. An AGC (automatic gain control) device in an OFDM (orthogonal frequency division multiplexing) system, comprising:
   an RF (radio frequency) unit for controlling a gain of an input signal;
   a first energy calculator for calculating an energy of output of the RF unit;
   a first accumulator for accumulating the energy calculated by the first energy calculator, finding a mean value thereof, and outputting the mean value;
   a second accumulator for accumulating output of the RF unit, calculating a mean value of the accumulated output and outputting the mean value as a DC offset;
   a second energy calculator for calculating an energy of the DC offset outputted by the second accumulator;
   a first subtractor for subtracting the energy of the DC offset of the input signal output by the second energy calculator from the energy of the input signal output by the first accumulator; and
   a second subtractor for subtracting a specific reference value established for AGC from an output of the first subtractor, and performing feedback of an output of the second subtractor for AGC to the RF unit.

2. The AGC device of claim 1, wherein the energy calculation for AGC is performed in a training sequence interval of the input signal.

3. The AGC device of claim 2, wherein the energy calculation is performed for each interval of 16 samples when the training sequence interval is a short training sequence interval.

4. The AGC device of claim 2, wherein the energy calculation is performed for each interval of 64 samples when the training sequence interval is a long training sequence interval.

5. The AGC device of claim 1, wherein the first and second energy calculators find a summation of the square of the input signal, and output a result as an energy.

6. The AGC device of claim 5, wherein the energy Enêrgy output by the first accumulator is given as $$\hat{\text{Energy}} = \frac{1}{N}\sum_{n=1}^{N}[Si(n)^2 + Sq(n)^2] + [Di^2 + Dq^2]$$

wherein I and Q values of the training sequence input to the first energy calculator are expressed as the summation of ideal signals $S_i$ and $S_q$ (i.e., without DC offsets) and DC offsets $D_i$ and $D_q$, a mean value of the $S_i$ and $S_q$ is zero in a specific interval N, and the $D_i$ and $D_q$ are constants.

7. The AGC device of claim 6, wherein the energy E output by the second energy calculator is expressed by the equation $$E = D_i^2 + D_q^2.$$

8. The AGC device of claim 7, wherein the energy Energy output by the first subtractor is expressed by the following equation and represents an ideal signal without DC offsets $$\widehat{\text{Energy}} = \frac{1}{N}\sum_{n=1}^{N}[Si(n)^2 + Sq(n)^2].$$

9. The AGC device of claim 1, further comprising a decibel (dB) converter provided between the first subtractor and the second subtractor, the dB converter converting an output of the subtractor into a dB value.

10. The AGC device of claim 1, further comprising:
- an A/D (analog-to-digital) converter for converting the input signal into a digital signal, and inputting the digital signal to the first energy calculator and the second accumulator; and
- a D/A (digit-to-analog) converting an output of the second subtractor into an analog signal, and outputting the analog signal to the RF unit.

11. An AGC (automatic gain control) method in an OFDM (orthogonal frequency division multiplexing) system, comprising:
- (a) performing coarse AGC through a DC offset cancellation in a short training sequence interval when an input signal is detected, the AGC being performed by subtracting an energy of the DC offset from an energy of the input signal and using an energy of the DC offset cancelled ideal signal, the DC offset being a mean value of the input signal accumulated for the specified period;
- (b) performing a coarse frequency offset search and cancellation in the short training sequence interval;
- (c) performing fine AGC through a DC offset cancellation in a long training sequence interval, the AGC being performed by subtracting the energy of the DC offset from the energy of the input signal and using the energy of the DC offset cancelled ideal signal; and
- (d) performing a fine frequency offset search and cancellation in the long training sequence interval.

12. The AGC method of claim 11, wherein the AGC in (a) is performed for each unit of 16 samples in the short training sequence interval.

13. The AGC method of claim 11, wherein the AGC in (c) is performed for each unit of 64 samples in the long training sequence interval.

14. The AGC method of claim 11, wherein (b) is performed in a final three repeated intervals of the short training sequence.

\* \* \* \* \*